United States Patent
Nagai (10) Patent No.: US 10,126,325 B2
(45) Date of Patent: Nov. 13, 2018

(54) SCANNING PROBE MICROSCOPE

(71) Applicant: Shimadzu Corporation, Kyoto (JP)

(72) Inventor: Masamichi Nagai, Kyoto (JP)

(73) Assignee: Shimadzu Corporation, Nishinokyo Kuwabaracho, Nakagyo-ku, Kyoto-shi, Kyoto (JP)

( * ) Notice: Subject to any disclaimer, the term of this patent is extended or adjusted under 35 U.S.C. 154(b) by 0 days.

(21) Appl. No.: 15/576,507

(22) PCT Filed: May 22, 2015

(86) PCT No.: PCT/JP2015/064690
§ 371 (c)(1),
(2) Date: Nov. 22, 2017

(87) PCT Pub. No.: WO2016/189575
PCT Pub. Date: Dec. 1, 2016

(65) Prior Publication Data
US 2018/0172726 A1    Jun. 21, 2018

(51) Int. Cl.
*G01Q 20/02* (2010.01)
*G01Q 30/04* (2010.01)
*G03F 7/20* (2006.01)
*G06F 3/147* (2006.01)

(52) U.S. Cl.
CPC ............ *G01Q 20/02* (2013.01); *G01Q 30/04* (2013.01); *G03F 7/2049* (2013.01); *G06F 3/147* (2013.01)

(58) Field of Classification Search
CPC ........ G01Q 20/02; G01Q 30/04; G06F 3/147; B82Y 35/00
See application file for complete search history.

(56) References Cited

U.S. PATENT DOCUMENTS

| | | | | |
|---|---|---|---|---|
| 8,887,311 B1 * | 11/2014 | Kirishima | ............. | G01Q 20/02 850/5 |
| 2007/0158554 A1 * | 7/2007 | Kobayashi | ............. | B82Y 35/00 250/309 |
| 2007/0180889 A1 * | 8/2007 | Murayama | ............. | B82Y 35/00 73/1.79 |

FOREIGN PATENT DOCUMENTS

| | | |
|---|---|---|
| JP | 2012-225722 | 11/2012 |
| JP | 2014-044144 | 3/2014 |

* cited by examiner

*Primary Examiner* — David E Smith
(74) *Attorney, Agent, or Firm* — Muir Patent Law, PLLC (57) ABSTRACT

An image capturing control unit controls a video camera so as to capture an image while switching between a first image capturing condition suitable for capturing a laser light spot and a second image capturing condition suitable for capturing an image of a cantilever for each single image. The image composition unit creates an image in which a laser light spot image and a cantilever image clearly appearing in each of two consecutive images are composed and displays the image on a display unit. A laser light center position detection unit, a cantilever tip position detection unit, and a position adjustment amount calculation unit calculate a position adjustment amount for adjusting an optical axis from a laser light center position and a cantilever tip position obtained by image processing from two each of two consecutive images, and also display the calculated numeric value on the display unit.

8 Claims, 6 Drawing Sheets

(Conventional Art)

FIG. 8

SCANNING PROBE MICROSCOPE

TECHNICAL FIELD

The present invention relates to a scanning probe microscope, more particularly to a scanning probe microscope equipped with a displacement detection unit for optically detecting a mechanical displacement of a cantilever provided with a probe.

BACKGROUND ART

As an apparatus for performing observation of a surface, measurement of surface roughness, etc., of a metal, a semiconductor, a ceramic, a synthetic resin or the like, a scanning probe microscope (SPM=Scanning Probe Microscope) exemplified by an atomic force microscope (AFM=Atomic Force Microscope) for measuring atomic force acting between a probe and a sample surface is widely known. In an atomic force microscope, several measurement modes are used. Recently, a method called a non-contact mode or a dynamic mode is often used in which a cantilever provided with a probe is caused to be vibrated at a resonance point or the vicinity thereof and the interaction acting between the probe and a sample surface in the vibrating state is converted into changes in amplitude, phase, or frequency of vibration of the cantilever and detected.

Figure 7:
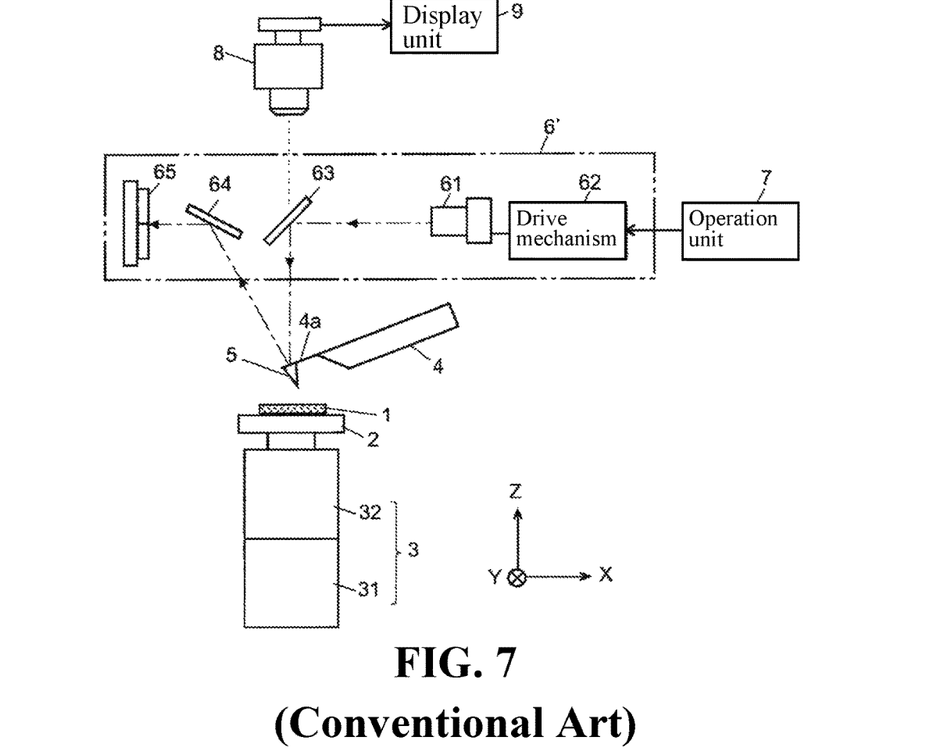
FIG. 7 is a configuration diagram of a main part of a commonly-used scanning probe microscope.

FIG. 7 is a configuration diagram of a main part of a commonly-used scanning probe microscope. A sample 1 which is an observation target is held on a sample table 2 provided on a substantially cylindrical scanner 3. The scanner 3 includes an XY-scanner 31 that scans the sample 1 in 2-axis directions of X and Y which are mutually orthogonal and a Z-scanner 32 that finely moves the sample 1 in a Z-axis direction orthogonal to the X-axis and the Y-axis. In each scanner, a piezoelectric element that causes displacement by a voltage applied from the outside is used as a driving source. A cantilever 4 equipped with a probe 5 at its tip is arranged above the sample 1, and this cantilever 4 is vibrated by an excitation unit including a piezoelectric element (not illustrated).

In order to detect the displacement of the cantilever 4 in the Z-axis direction, an optical displacement detector 6 including a laser light source 61, a half mirror 63, a mirror 64, and a light detector 65 is provided above the cantilever 4. In the optical displacement detector 6, laser light emitted from the laser light source 61 is substantially perpendicularly reflected by the half mirror 63 and then irradiated to the reflection surface 4a provided on the rear surface of the tip portion of the cantilever 4. The light reflected by the reflection surface 4a of this cantilever 4 is incident to the light detector 65 via the mirror 64. The light detector 65 is, for example, a four-division light detector having a light-receiving surface divided into four in the Z-axis direction and the Y-axis direction. When the cantilever 4 is displaced in the Z-axis direction, the ratio of the amount of light incident to the plurality of light receiving surfaces changes. The amount of displacement of the cantilever 4 can be calculated by performing calculation processing of the detection signal corresponding to the plurality of received light quantity.

The measurement operation of the scanning probe microscope of the aforementioned configuration in the non-contact mode will be briefly described.

By an excitation unit (not illustrated), the cantilever 4 is vibrated in the Z-axis direction at the resonance point or the vicinity thereof. At this time, when an attractive force or a repulsive force acts between the probe 5 and the surface of the sample 1, the vibration amplitude of the cantilever 4 changes. A minute change amount of the vibration amplitude is detected by a detection signal at the light detector 65, and the piezoelectric element of the Z-scanner 32 is feedback-controlled to move the sample 1 in the Z-axis direction so as to set the change amount to zero, that is, keep the vibration amplitude constant. When the sample 1 is scanned in the X-Y plane by controlling the piezoelectric element of the XY-scanner 31 in such a state, the aforementioned feedback control amount with respect to the Z-axis direction reflects minute unevenness on the surface of the sample 1. Therefore, a data processing unit (not illustrated) creates a surface image of the sample 1 using a signal indicating this feedback control amount.

In such a scanning probe microscope, it is configured such that the position adjustment of the laser light source 61 and that of the light detector 65 are respectively performed so that the strongest laser light reflected by the reflection surface 4a of the cantilever 4 is incident to the center of the four-division light receiving surface of the light detector 65 in a state in which there is no deflection in the cantilever 4. Such adjustment in the scanning probe microscope is called "optical axis adjustment" (see, e.g., Patent Documents 1 and 2).

Figure 8:
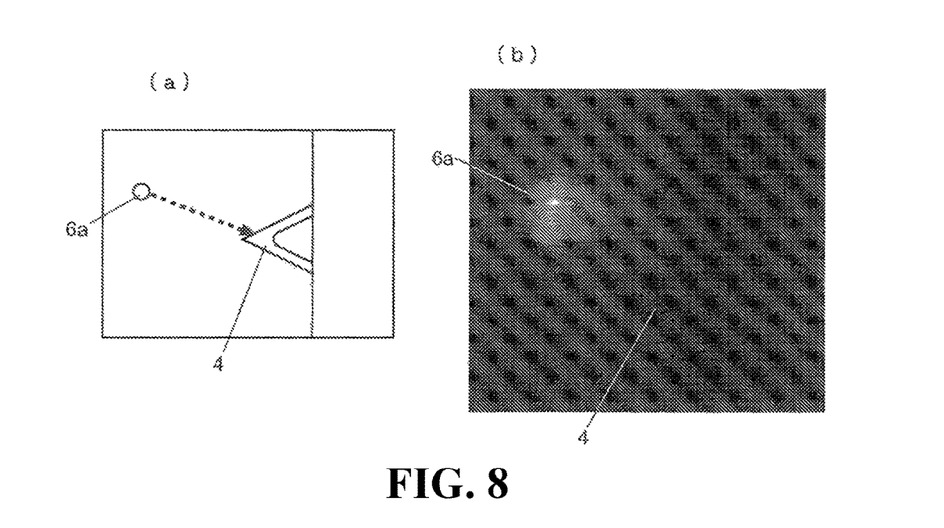
FIG. 8 shows an ideal captured image (a) and an example of an actually obtained image (b) at the time of optical axis adjustment.

The procedure of a conventional general optical axis adjustment is as follows. That is, first, an image in which the tip end portion of the cantilever 4 or the vicinity thereof is captured from directly above with a video camera 8 capable of performing optical microscopic observation is displayed on the screen of the display unit 9. The left side of FIG. 8 illustrates an ideal captured image (a) at the time of the optical axis adjustment. While confirming this image, an operator performs a predetermined operation with an operation unit 7 so that the laser light spot image 6a comes to an appropriate position at the tip of the cantilever 4 to adjust the position of the laser light source 61 with a drive mechanism 62. As described in Patent Document 1, it is preferable that laser light is projected on a piece of paper placed in front of the light detector 65 and the position of the laser light source 61 is finely adjusted so that the laser light appears most brightly in the projected image. After determining the position of the laser light source 61, the position of the light detector 65 is adjusted so that the spot of the laser light reflected by the cantilever 4 is located at the center of the four-division light receiving surface of the light detector 65.

As described above, in general, the optical axis adjustment in the scanning probe microscope is performed manually by an operator while visually confirming the image captured for the optical axis adjustment. However, as also pointed out in Patent Document 1, since the luminance of the laser light spot is considerably high, as one example is shown on the right side of FIG. 8, in an image (b) captured so that both the laser light spot image 6a and the cantilever 4 fit in the image, the portion including the cantilever 4 becomes considerably dark. It is difficult for the operator to properly grasp the position of the cantilever 4 from such an image. This is one of factors making the operation of the optical axis adjustment difficult.

In order to solve such a problem, in Patent Document 1, a marker indicating the position of the cantilever and a marker indicating the brightness centroid position of the laser light are displayed on an image so that the optical axis adjustment can be performed using these markers. Of course, even with such a method, the optical axis adjustment can be performed, but for an operator familiar with a conventional optical axis adjustment operation, the position adjustment using markers may sometimes be difficult to understand intuitively. For this reason, there is also a strong demand to perform the position adjustment while observing not a marker displayed on an image but an actually captured object image.

PRIOR ART

Patent Document

Patent Document 1: Japanese Unexamined Patent Application Publication No. 2012-225722

Patent Document 2: Japanese Unexamined Patent Application Publication No. 2014-44144

SUMMARY OF THE INVENTION

Problems to be Solved by the Invention

The present invention was made to solve the aforementioned problems, and a first object of the present invention is to provide a scanning probe microscope capable of accurately performing an optical axis adjustment while observing a cantilever and a laser light spot on an actual observation image by an operator.

A second object of the present invention is to provide a scanning probe microscope which can automatically perform accurate optical axis adjustment based on an accurate grasp of a tip position of a cantilever and a position of a laser light spot.

Means for Solving the Problems

The present invention was made to solve the aforementioned problems, and is directed to a scanning probe microscope comprising a cantilever displacement detection unit including a flexible cantilever provided with a probe, a laser light source unit, a reflector configured to reflect laser light emitted from the laser light source unit to irradiate the laser light to the cantilever, and a detector configured to detect light reflected from the cantilever with respect to irradiation light; a drive unit configured to move at least one of the reflector and the laser light source unit for an optical axis adjustment in the cantilever displacement detector; and an image capturing unit configured to capture an image of the cantilever and a vicinity thereof to which light is irradiated for the optical axis adjustment, characterized in that the scanning probe microscope includes a) an image capturing control unit configured to perform image capturing while switching a first image capturing condition suitable for performing image capturing of a laser light spot formed by irradiation of the laser light to the cantilever and a second image capturing condition suitable for performing image capturing of the cantilever, b) a composite image creation unit configured to create an image in which both a laser light spot image and a cantilever image appears by performing processing of composing an image captured under the first image capturing condition and an image captured under the second image capturing condition, and c) a display unit configured to display the image created by the composite image creation unit in order for an operator to perform the optical axis adjustment using the drive unit or for the operator to confirm a result of the optical axis adjustment.

In the scanning probe microscope according to the present invention, the first image capturing condition and the second image capturing condition may be different in exposure conditions, for example. When image capturing is performed in a state in which the image capturing control unit sets the first image capturing condition in the image capturing unit, an image is obtained in which a high luminance laser light spot image appears clearly although the cantilever is hardly visible due to insufficient exposure. On the other hand, when image capturing is performed in a state in which the image capturing control unit sets the second image capturing condition in the image capturing unit, an image is obtained in which the image of the cantilever appears clearly although the laser light spot is hardly visible due to overexposure. The composite image creation unit creates a composite image of a laser light spot image clearly appearing in the image captured under the first image capturing condition and a cantilever image clearly appearing in the image captured under the second image capturing condition. The display unit displays the composite image.

The composite image displayed as described above is an image with the exposure properly adjusted for each of the laser light spot and the cantilever appeared in the composite image. Both of the image of the laser light spot and the image of the cantilever are clear. Therefore, when an operator manually performs the optical axis adjustment using the drive unit, it is possible for the operator to accurately grasp the positional relationship between the laser light spot and the cantilever from the displayed image, which enables easy and reliable optical axis adjustment. Also, when an optical axis adjustment is performed automatically as will be described later, the operator can check whether or not the optical axis adjustment was properly performed based on the displayed image.

In the scanning probe microscope according to the present invention, preferably, it is configured such that the image capturing control unit performs image capturing under the first image capturing condition and image capturing under the second image capturing condition alternately for each single image; the composite image creation unit creates a composite image every time a new single image is captured by the image capturing unit by performing processing of composing a single image captured under the first image capturing condition and a single image captured under the second image capturing condition continuously captured by the image capturing unit; and the display unit displays the composite image.

According to this configuration, the laser light source unit and the reflector are driven by the drive unit for the optical axis adjustment, and when the position of the laser light spot moves, the latest image following the movement is displayed on the display unit. Therefore, even in both the manual adjustment and the automatic adjustment, the operator can confirm the latest state of the positional relationship between the laser light spot and the cantilever with an image and also can immediately grasp or judge whether or not the adjustment is appropriate.

In the scanning probe microscope according to a first aspect of the present invention, it may be configured such that an adjustment amount calculation unit configured to detect a center position of the laser light spot based on the image captured under the first image capturing condition, detect a tip position of the cantilever based on the image captured under the second image capturing condition, and calculate an adjustment amount for moving the laser light spot to a predetermined position of the cantilever based on a detected laser light spot center position and a detected cantilever tip position, wherein the display unit displays the adjustment amount calculated by the adjustment amount calculation unit together with the image created by the composite image creation unit.

Further, in a scanning probe microscope according to the second aspect of the present invention, it may be configured such that the scanning probe microscope further comprises an adjustment amount calculation unit configured to detect a center position of the laser light spot based on the image captured under the first image capturing condition, detect a tip position of the cantilever based on the image captured under the second image capturing condition, and calculate an adjustment amount for moving the laser light spot to a predetermined position of the cantilever based on a detected laser light spot center position and a detected cantilever tip position; and an optical axis adjustment control unit configured to move the laser light spot to a predetermined position of the cantilever by operating the drive unit based on the adjustment amount calculated by the adjustment amount calculation unit.

In the scanning probe microscope according to the first and second aspects, the adjustment amount calculation unit detects the center position of the laser light spot based on the image captured under the first image capturing condition, and detects the tip position of the cantilever based on the image captured under the second image capturing condition. Note that the center position of the laser light spot can be obtained, for example, by calculating a multivalued center of gravity, but if the influence of light diffraction or scattering is large, it may be configured such that noise removal using opening processing or the like by morphological operation processing is performed and thereafter the multivalued centroid is calculated. Based on the coordinate of the center position of the laser light spot and the coordinate of the tip position of the cantilever, the adjustment amount calculation unit calculates an adjustment amount for moving the laser light spot to a predetermined position (e.g., a tip position) of the cantilever. This adjustment amount may be, for example, the respective distances in the two directions perpendicular to one another in the plane of the image.

In the scanning probe microscope of the first aspect, the adjustment amount calculated as described above is displayed as, for example, a numerical value together with the image. Therefore, an operator can perform a more detailed optical axis adjustment by referring to the displayed adjustment amount while roughly performing the optical axis adjustment while looking at the displayed image.

On the other hand, in the scanning probe microscope according to the second aspect, based on the adjustment amount calculated as described above, the optical axis adjustment control unit operates the drive unit, so that the automatic optical axis adjustment is achieved. Therefore, it is not necessary for the operator him/herself to perform troublesome operations on the optical axis adjustment, and it becomes enough to perform final confirmation on whether or not the optical axis adjustment is appropriate by looking at the displayed image.

Effects of the Invention

According to the scanning probe microscope according to the present invention, at the time of performing the optical axis adjustment, the operator can confirm an image with which both the laser light spot and the cantilever are clearly observable, which is not clearly shown by normal image capturing. As a result, in the case of performing the optical axis adjustment manually, the operation can be performed easily and accurately. Further, even in the case of performing the optical adjustment automatically, it becomes possible for the operator to easily confirm the result of the automatic adjustment.

According to the scanning probe microscope of the first aspect of the present invention, the operator can easily perform an accurate optical axis adjustment. Therefore, for example, even those who is unfamiliar with such an operation can perform the adjustment. It is also possible to reduce variations in optical axis adjustment for each operator. According to the scanning probe microscope of the second aspect of the present invention, since troublesome optical axis adjustments are automated, the burden of the operator is reduced and variations in the optical axis adjustment for each operator can also be eliminated.

EMBODIMENTS FOR CARRYING OUT THE INVENTION

Figure 1:
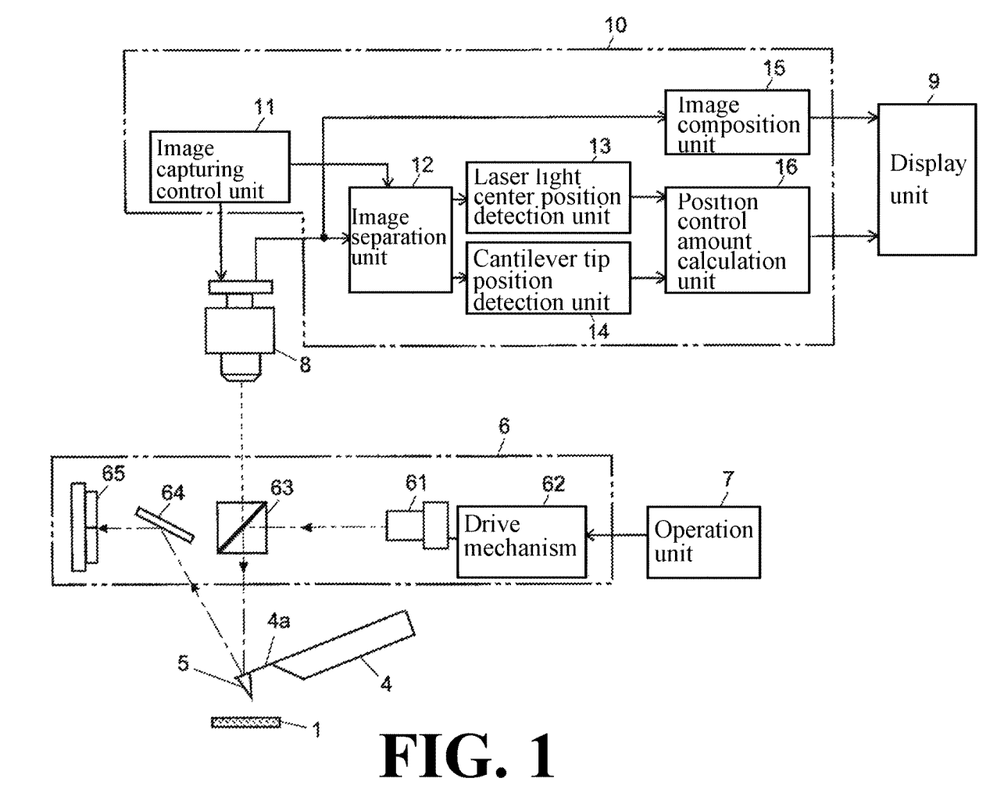
FIG. 1 is a configuration diagram of a main part of a scanning probe microscope according to an embodiment of the present invention.

Hereinafter, a scanning probe microscope which is an embodiment of the present invention will be described with reference to the accompanying drawings. FIG. 1 is a configuration diagram of a main part of the scanning probe microscope according to this embodiment. The same reference numerals will be allotted to the same components as those of the conventional scanning probe microscope shown in FIG. 7, and the detailed description thereof will be omitted.

The scanning probe microscope according to this embodiment is provided with, as a constituent element which is not included in a conventional apparatus, an optical axis adjustment control/processing unit 10 having a function of controlling the video camera 8 and processing image data captured by the video camera 8. The optical axis adjustment control/processing unit 10 includes an image capturing control unit 11, an image separation unit 12, a laser light center position detection unit 13, a cantilever tip position detection unit 14, an image composition unit 15, and a position adjustment amount calculation unit 16 as function blocks. It is configured such that outputs of the image composition unit 15 and the position adjustment amount calculation unit 16 are displayed on the screen of the display unit 9.

Figure 3:
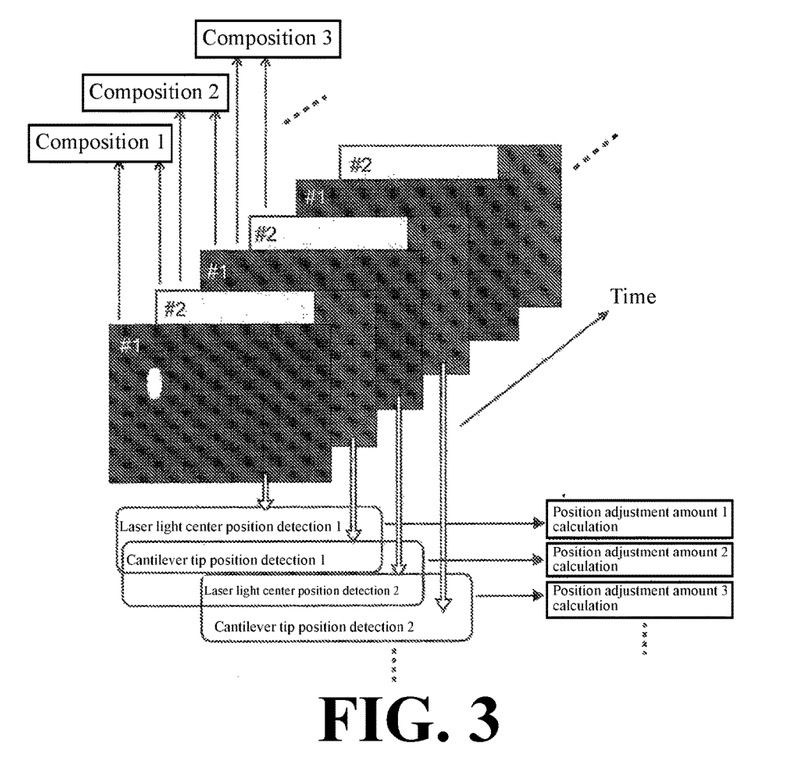
FIG. 3 is an explanatory diagram of processing performed by the optical axis adjustment control/processing unit in the scanning probe microscope of this embodiment.

The characteristic operations of the scanning probe microscope of this embodiment will be described. FIG. 3 is a schematic diagram for explaining the processing performed in the optical axis adjustment control/processing unit 10.

The image capturing control unit 11 controls the image capturing operation of the video camera 8 so that image capturing under a first image capturing condition suitable for performing image capturing of the laser light spot and image capturing under a second image capturing condition suitable for performing image capturing of the cantilever 4 are performed alternately for each frame. Normally, the difference between the first image capturing condition and the second image capturing condition is a difference in exposure. That is, the luminance of the laser light spot image is quite high, whereas since the laser light is not irradiated to the cantilever 4 much, the luminance is considerably low. For this reason, the first image capturing condition is set so that the exposure is significantly reduced compared with the second image capturing condition. As an appropriate exposure in each image capturing, a default value previously set by a manufacturer may be used. However, it is more preferable that each user determine the appropriate exposure in advance by experiments, which enables more appropriate image capturing. Therefore, it is preferable that the first and second image capturing conditions be set by the user through an input unit (not illustrated) or the like.

When the operator gives a predetermined instruction from the input unit (not illustrated) to perform the optical axis adjustment, under the control of the image capturing control unit 11, the video camera 8 initiates continuous image capturing in a predetermined two-dimensional range near the reflection surface 4a of the cantilever 4. Since the image capturing conditions (that is, exposure) are alternately switched each time an image of one frame is obtained by image capturing, the image data obtained under the first image capturing condition and the image data obtained under the second image capturing condition are alternately output from the video camera 8.

Figure 2:
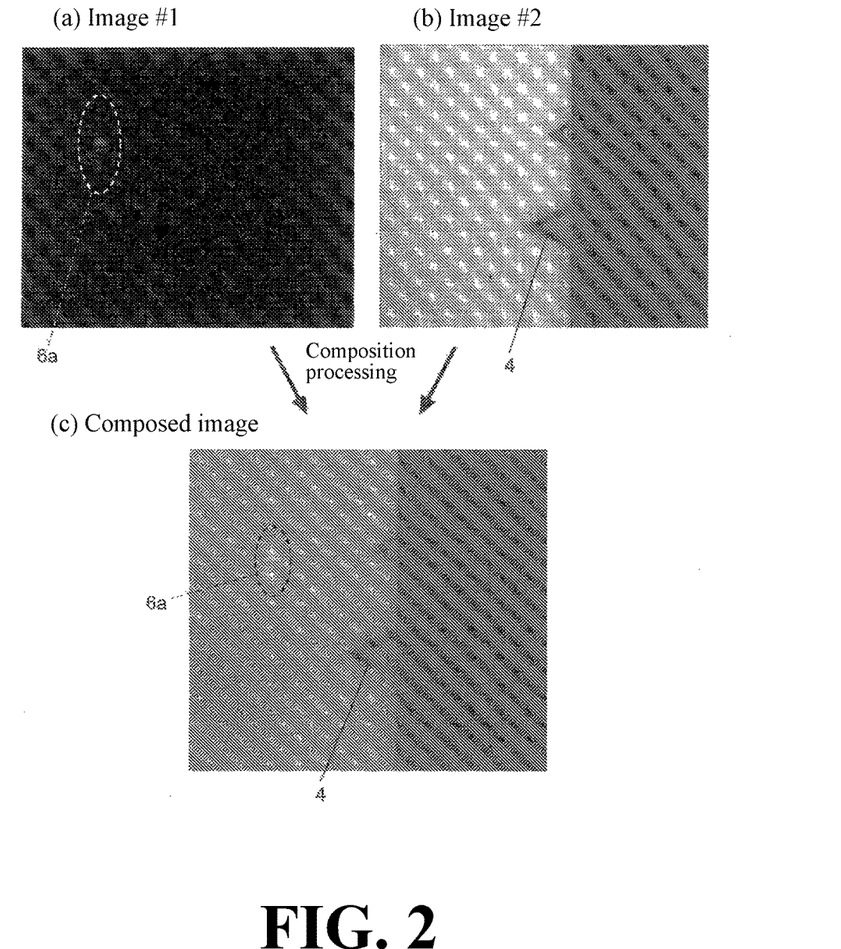
FIG. 2 is an explanatory diagram of image composition processing for optical axis adjustment in the scanning probe microscope of this embodiment.

FIG. 2 illustrates (a) Image #1, (b) Image #2 and (c) Composed image. (a) Image #1 of FIG. 2 FIG. 2(*a*) is an example of an image #1 obtained under the first image capturing condition, and (b) Image #2 of FIG. 2 FIG. 2(*b*) is an example of an image #2 obtained under the second image capturing condition. In the first image capturing condition, the laser light spot is properly exposed and therefore the laser light spot image 6a clearly appears. However, the cantilever 4 is underexposed and therefore the image is hardly recognized. On the other hand, in the second image capturing condition, the cantilever 4 is properly exposed and therefore the image of the cantilever 4 appears clearly. However, the laser light spot is overexposed, and therefore the image of the laser light spot is hardly recognized because it is too bright.

The data constituting two types of images #1 and #2 alternately output from the video camera 8 are sequentially input to the image composition unit 15. The image composition unit 15 creates an image in which the laser light spot image 6a and the image of the cantilever 4 are composed on the basis of the image data of two temporally continuous frames every frame. Specifically, as shown in (a) Image #1 of FIG. 2, in the image #1 obtained under the first image capturing condition, substantially only the laser light spot image 6a appears. Therefore, for example, the brightness of the entire image is raised so that the portion other than the laser light spot image 6a is brightened. Then, the brightened image and the image #2 obtained under the second image capturing condition are composed. With this, an image is obtained in which both the laser light spot image 6a and the image of the cantilever 4 clearly appear (see (c) Composed image of FIG. 2). The image data composed as described above is sent to the display unit 9 and displayed on the screen of the display unit 9. As shown in FIG. 3, since the composition processing of the images of two frames is performed for each frame, the image obtained by the latest image capturing is always displayed on the display unit 9.

On the other hand, the data constituting two types of images #1 and #2 alternately output from the video camera 8 are also input to the image separation unit 12. The image separation unit 12 alternately sorts the image data for each frame. The data constituting the image #1 obtained under the first image capturing condition is input to the laser light center position detection unit 13, and the data constituting the image #2 obtained under the second image capturing condition is input to the cantilever tip position detection unit 14. The laser light center position detection unit 13, the cantilever tip position detection unit 14, and the position adjustment amount calculation unit 16 calculate a position adjustment amount for optical axis adjustment in accordance with the flowchart shown in FIG. 5.

That is, the laser light center position detection unit 13 creates a mask image that shields portions other than the original laser light spot from the image #1 in which the laser light spot image 6a appears as shown in (a) Image #1 of FIG. 2 (Step S1). The mask image is created because the laser light spot image included in the captured image contains a false image called noise which is not the original laser light spot due to the influence of diffraction, scattering and other disturbances. It is hard to recognize in (a) Image #1 of FIG. 2. But in image (b) of FIG. 8, it can be recognized that a plurality of such false images appear in an overlapped manner so as to be lined up in the vertical direction.

Figure 5:
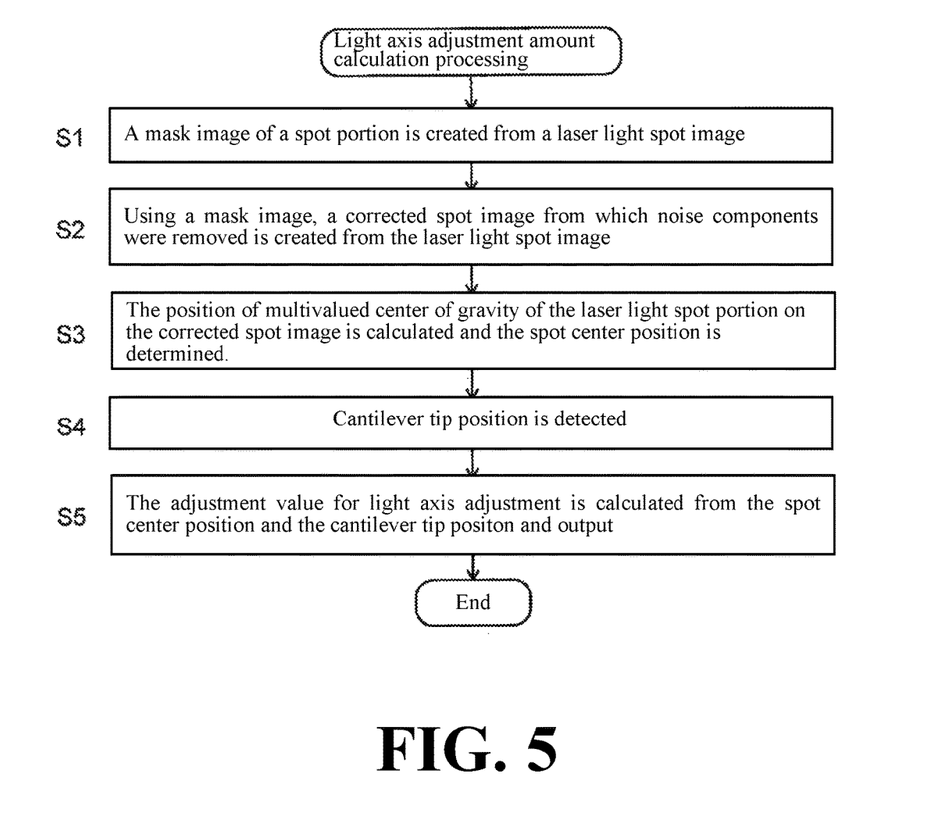
FIG. 5 is a flowchart showing the procedure of the optical axis adjustment amount calculation processing in the scanning probe microscope of this embodiment.

Various methods commonly used in image processing can be used to create a mask image. The first method of creating a mask image is a method using opening processing by morphological operation processing. In this processing, noise around the target image of interest can be removed by combining N times of contraction processing and N times of expansion processing. With this, a mask image which shields noise portions due to the influences of diffraction or scattering can be obtained. The second method of creating a mask image is a method of combining edge (contour) detection using a Laplacian filter and smoothing using a Gaussian filter. Other than the above, noise elimination using labeling and the like can also be used.

After obtaining a mask image, the laser light center position detection unit 13 takes the logical product of the original image and the mask image on a pixel-by-pixel basis and creates a corrected spot image in which only the laser light spot image which is presumed to be original appears (Step S2). In this corrected spot image, the multivalued center of gravity of the laser light spot image portion is calculated, and the calculated position coordinates of the center of gravity are determined as the center position of the laser light spot (Step S3).

Figure 4:
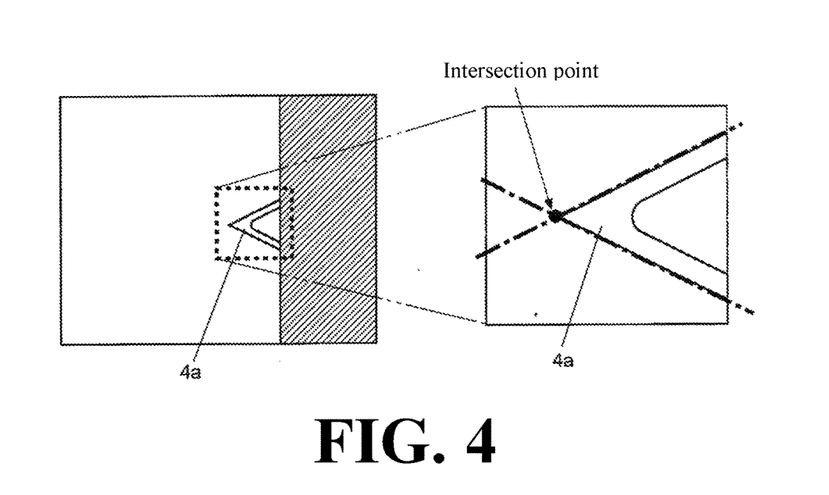
FIG. 4 is an explanatory diagram of cantilever tip position detection processing for optical axis adjustment in the scanning probe microscope of this embodiment.

On the other hand, the cantilever tip position detection unit 14 obtains the position of the sharp cantilever extreme tip from the image #2 in which the image of the cantilever 4 is appeared as shown in (b) Image #2 of FIG. 2 (Step S4). FIG. 4 is an explanatory diagram of cantilever tip position detection processing. In this case, using the fact that the tip shape of many cantilevers is a triangular shape, first, a cantilever portion is cut out from the image #2 in which the cantilever appears by image recognition or the like. Next, from the cut-out image, straight lines of two sides of a triangle along the outline of the cantilever are calculated. Then, it is determined that the position of the intersection point of the straight lines of these two sides is the most tip position of the cantilever.

Since the center position of the laser light spot and the most tip position of the cantilever are obtained in this way, the position adjustment amount calculation unit 16 calculates the position adjustment amount necessary for the optical axis adjustment from the two position information (Step S5). Specifically, it is only necessary to calculate the difference between the two position information in two orthogonal axial directions within the plane of the image, that is, in the X-direction and the Y-direction, and use this as the position adjustment amount. Further, the difference converted to the actual length may be used as the position adjustment amount. The value of the position adjustment amount thus calculated is also sent to the display unit 9 and displayed together with the above image on the screen of the display unit 9. Since the calculation of the position adjustment amount is also performed for each frame in the same manner as the image combining processing, the display unit 9 always displays the position adjustment amount based on the image obtained by the latest image capturing.

The operator operates the operation unit 7 while watching the image displayed on the screen of the display unit 9 and the numerical value of the position adjustment amount. In response to this operation, the drive mechanism 62 moves the laser light source 61, so the position of the spot formed by the laser light reflected by the half mirror 63 also moves. By roughly performing adjustment so that the laser light spot image 6a on the displayed image comes to the tip of the cantilever 4 and eventually finely adjusting while looking at the value of the position adjustment amount, the laser light optical axis adjustment can be performed so that the laser light hits the reflection surface 4a of the cantilever 4.

Figure 6:
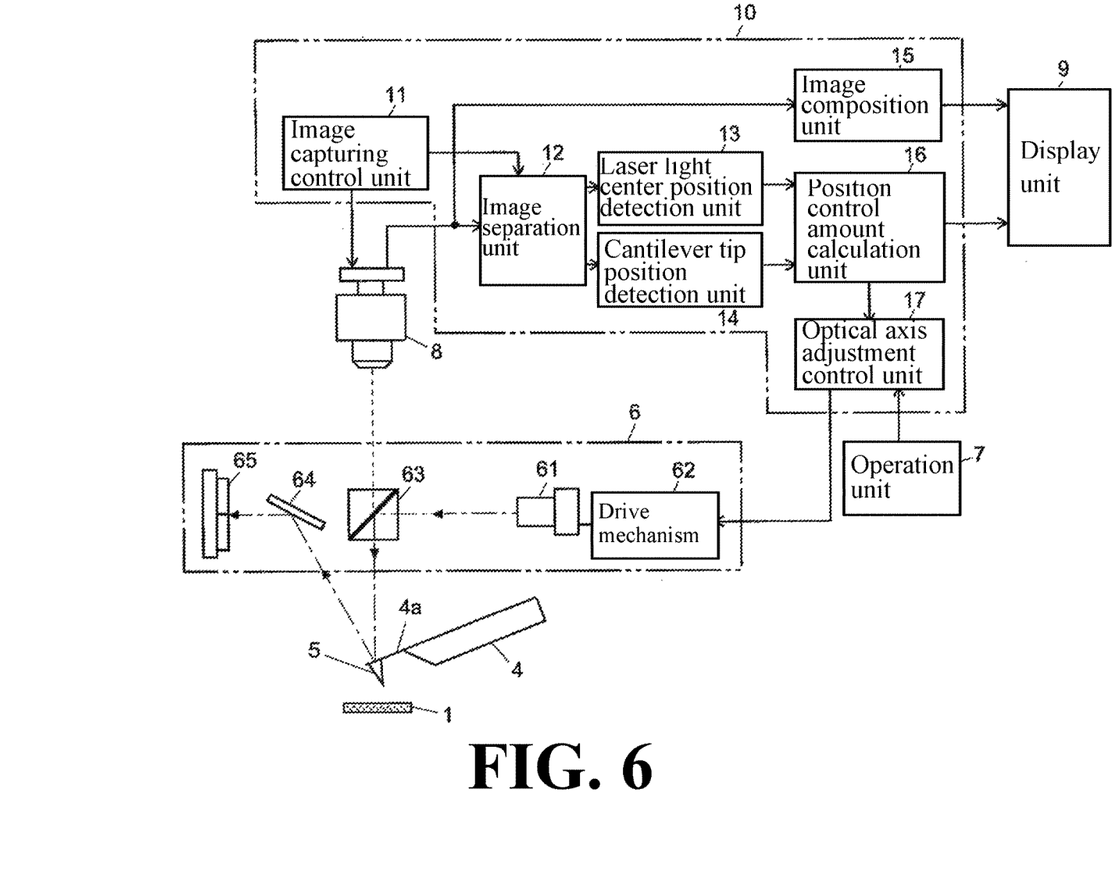
FIG. 6 is a configuration diagram of a main part of a scanning probe microscope according to another embodiment of the present invention.

Next, a scanning probe microscope which is another embodiment of the present invention will be described with reference to the accompanying drawings. FIG. 6 is a configuration diagram of a main part of this embodiment. The same reference numerals will be allotted to the same components as those of the scanning probe microscope of this embodiment shown in FIG. 1, and the detailed description thereof will be omitted.

In the scanning probe microscope of the aforementioned embodiment, an operator manually adjusts the position of the laser light source 61. However, in the scanning probe microscope of this embodiment, an optical axis adjustment control unit 17 is provided in the optical axis adjustment control/processing unit 10 in order to automatically perform such adjustment.

That is, as described in the aforementioned embodiment, when the position adjustment amount calculation unit 16 calculates the position adjustment amount, the optical axis adjustment control unit 17 converts the position adjustment amount into the drive amount of the drive mechanism 62. Then, the laser light source 61 is moved by a predetermined amount via the drive mechanism 62 so that the laser light spot comes to a predetermined position of the reflection surface 4a of the cantilever 4. As a result, the optical axis adjustment is achieved without performing troublesome adjustment operations by an operator. Of course, in the same manner as in the aforementioned embodiment, since the composed image is displayed on the screen of the display unit 9, the operator can confirm whether or not the optical axis adjustment has no problem by looking at the image.

In the aforementioned embodiment, the tip position is detected assuming that the shape of the tip portion of the cantilever is a triangular shape, but even if the tip portion has another shape, the tip position can be easily detected by another method. For example, when the tip shape is a rectangular shape, one side including the most distal end portion may be obtained and assumed that the central portion of the side is the most tip position.

In the aforementioned embodiment, the optical axis adjustment is performed by adjusting the position of the laser light source 61. However, since the position where the laser light spot is formed also changes by adjusting the position and the inclination angle of the half mirror 63, the optical axis adjustment can be performed.

It should be noted that the aforementioned embodiment is merely an example of the present invention, and even if appropriate corrections, changes, and additions are made within the scope of the gist of the present invention, it is encompassed within the claim of the present application.

DESCRIPTION OF REFERENCE SYMBOLS

1: sample
2: sample table
10: optical axis adjustment control/processing unit
11: image capturing control unit
12: image separation unit
13: laser light center position detection unit
14: cantilever tip position detection unit
15: image composition unit
16: position adjustment amount calculation unit
17: optical axis adjustment control unit
3: scanner
4: cantilever
4a: reflection surface
5: probe
6: optical displacement detector
61: laser light source
62: drive mechanism
63: half mirror
64: mirror
65: light detector
6a: laser light spot
7: operation unit
8: video camera
9: display unit

The invention claimed is:
1. A scanning probe microscope comprising:
a cantilever displacement detection unit including a flexible cantilever provided with a probe, a laser light source unit, a reflector configured to reflect laser light emitted from the laser light source unit to irradiate the laser light to the cantilever, and a detector configured to detect light reflected from the cantilever with respect to irradiation light;
a drive unit configured to move at least one of the reflector and the laser light source unit for optical axis adjustment in the cantilever displacement detector; and
an image capturing unit configured to capture an image of the cantilever and a vicinity thereof to which light is irradiated for the optical axis adjustment, wherein
a) an image capturing control unit configured to perform image capturing while switching a first image capturing condition suitable for performing image capturing of a laser light spot formed by irradiation of the laser light to the cantilever and a second image capturing condition suitable for performing image capturing of the cantilever, b) a composite image creation unit configured to create an image in which both a laser light spot image and a cantilever image appears by performing processing of composing an image captured under the first image capturing condition and an image captured under the second image capturing condition, and c) a display unit configured to display the image created by the composite image creation unit in order for an operator to perform the optical axis adjustment using the drive unit or for the operator to confirm a result of the optical axis adjustment.

2. The scanning probe microscope as recited in claim 1, further comprising an adjustment amount calculation unit configured to detect a center position of the laser light spot based on the image captured under the first image capturing condition, detect a tip position of the cantilever based on the image captured under the second image capturing condition, and calculate an adjustment amount for moving the laser light spot to a predetermined position of the cantilever based on a detected laser light spot center position and a detected cantilever tip position, wherein the display unit displays the adjustment amount calculated by the adjustment amount calculation unit together with the image created by the composite image creation unit.

3. The scanning probe microscope as recited in claim 1, further comprising an adjustment amount calculation unit configured to detect a center position of the laser light spot based on the image captured under the first image capturing condition, detect a tip position of the cantilever based on the image captured under the second image capturing condition, and calculate an adjustment amount for moving the laser light spot to a predetermined position of the cantilever based on a detected laser light spot center position and a detected cantilever tip position; and an optical axis adjustment control unit configured to move the laser light spot to a predetermined position of the cantilever by operating the drive unit based on the adjustment amount calculated by the adjustment amount calculation unit.

4. The scanning probe microscope as recited in claim 1, wherein the image capturing control unit performs image capturing under the first image capturing condition and image capturing under the second image capturing condition alternately for each single image, and the composite image creation unit creates a composite image every time a new single image is captured by the image capturing unit by performing processing of composing a single image captured under the first image capturing condition and a single image captured under the second image capturing condition continuously captured by the image capturing unit, and the display unit displays the composite image.

5. The scanning probe microscope as recited in claim 2 or 3, wherein the adjustment amount calculation unit performs noise removal using opening processing by morphological operation processing when detecting the center position of the laser light spot based on the image captured under the first image capturing condition.

6. The scanning probe microscope as recited in claim 2, wherein the image capturing control unit performs image capturing under the first image capturing condition and image capturing under the second image capturing condition alternately for each single image, the composite image creation unit creates a composite image every time a new single image is captured by the image capturing unit by performing processing of composing a single image captured under the first image capturing condition and a single image captured under the second image capturing condition continuously captured by the image capturing unit, and the display unit displays the composite image.

7. The scanning probe microscope as recited in claim 3, wherein the image capturing control unit performs image capturing under the first image capturing condition and image capturing under the second image capturing condition alternately for each single image, the composite image creation unit creates a composite image every time a new single image is captured by the image capturing unit by performing processing of composing a single image captured under the first image capturing condition and a single image captured under the second image capturing condition continuously captured by the image capturing unit, and the display unit displays the composite image.

8. The scanning probe microscope as recited in claim 3, wherein the adjustment amount calculation unit performs noise removal using opening processing by morphological operation processing when detecting the center position of the laser light spot based on the image captured under the first image capturing condition.

* * * * *